(12) United States Patent
Kaya et al.

(10) Patent No.: US 11,121,704 B2
(45) Date of Patent: Sep. 14, 2021

(54) PARALLELLING MULTIPLE POWER SWITCHES

(71) Applicant: TEXAS INSTRUMENTS INCORPORATED, Dallas, TX (US)

(72) Inventors: Cetin Kaya, Plano, TX (US); Serkan Dusmez, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 377 days.

(21) Appl. No.: 15/960,537

(22) Filed: Apr. 23, 2018

(65) Prior Publication Data

US 2019/0326887 A1 Oct. 24, 2019

(51) Int. Cl.
*H03K 3/011* (2006.01)
*H03K 3/017* (2006.01)
*H03K 17/14* (2006.01)
*H03K 5/00* (2006.01)

(52) U.S. Cl.
CPC ............ *H03K 3/011* (2013.01); *H03K 3/017* (2013.01); *H03K 17/145* (2013.01); *H03K 5/00* (2013.01); *H03K 2005/00013* (2013.01)

(58) Field of Classification Search
CPC ....... H03K 17/145; H03K 3/011; H03K 3/017
See application file for complete search history.

(56) References Cited

U.S. PATENT DOCUMENTS 7,915,873 B2 3/2011 Yen
9,705,395 B2 7/2017 Tomas et al.
2003/0161167 A1 8/2003 Barnett et al.
2005/0248360 A1 11/2005 Patel et al.
2006/0061339 A1* 3/2006 Lewis ................ G05D 23/1934
323/237
2008/0211313 A1 9/2008 Nakamura
2009/0174485 A1 7/2009 Teng et al.
2011/0210713 A1 9/2011 Kazama
2017/0040894 A1 2/2017 MeVay
2017/0359059 A1 12/2017 Bazzani et al.
2018/0262193 A1 9/2018 Pidutti et al.

FOREIGN PATENT DOCUMENTS

EP 1432107 A2 6/2004

* cited by examiner

*Primary Examiner* — Lincoln D Donovan
*Assistant Examiner* — Colleen J O Toole
(74) *Attorney, Agent, or Firm* — Mark Allen Valetti; Charles A. Brill; Frank D. Cimino

(57) ABSTRACT

In described examples, a first power switching circuit receives a power switching control signal and activates a first power switch in response to the power switching control signal. A second power switching circuit receives the power switching control, activates a second power switch in response to the power switching control signal, and determines a first power switching delay in response to temperature indications of the first and second power switches. The second power switching circuit activates the second power switch at a first delayed time after the activation of the first power switch, where the first delayed time follows the activation of the first power switch by the determined first power switching delay.

19 Claims, 7 Drawing Sheets

PARALLELLING MULTIPLE POWER SWITCHES

BACKGROUND

Electronic devices are increasingly used in a wide diversity of applications for which semiconductor switches (e.g., transistors) are called upon to efficiently provide greater amounts of operating power. To increase the power capacity, the semiconductor switches are often used in conjunction with other semiconductor switches. However, differences in operating characteristics between the semiconductor switches can lead to inefficient operating conditions in which power is dissipated as heat.

SUMMARY

In described examples, a first power switching circuit receives a power switching control signal and activates a first power switch in response to the power switching control signal. A second power switching circuit receives the power switching control, activates a second power switch in response to the power switching control signal, and determines a first power switching delay in response to a temperature indications of the first and second power switches. The second power switching circuit activates the second power switch at a first delayed time after the activation of the first power switch, where the first delayed time follows the activation of the first power switch by the determined first power switching delay.

DETAILED DESCRIPTION

Figure 1:
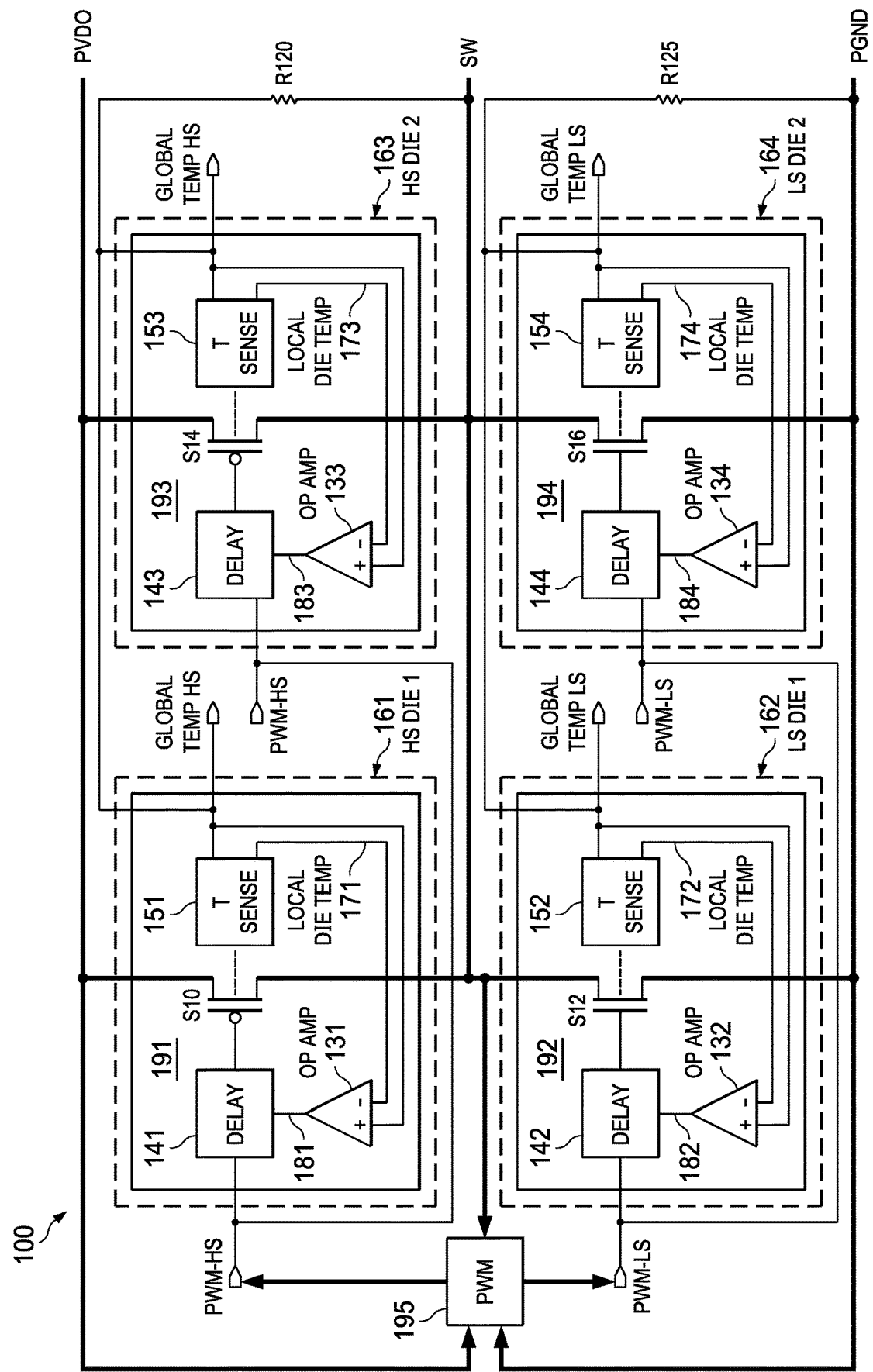
FIG. 1 is a schematic diagram of an example local temperature delta reference signal-controlled circuit for normalizing temperatures of power switching MOSFETs coupled in parallel.

Semiconductors are used as switches. The semiconductor switches can be MOSFETS (metal-oxide semiconductor field-effect transistors) formed using substrates, such as gallium nitride, silicon carbide, or silicon. The power-carrying capabilities of a MOSFET can be increased by increasing the size of the MOSFET to lower the MOSFET resistance drain-to-source when conducting ($R_{DS\text{-}on}$). However, increasing the size of the MOSFET to accommodate an increase on the order of kilowatts, can result in manufacturing yield problems of such devices (e.g., which would need to be robust for operating in high-power applications) and/or result in excessive heat buildup in the die of the MOSFET. Additionally, a die can include more than one MOSFET, such that excessive heat buildup can affect more than one MOSFET used as a switch.

Variations in temperature of the MOSFET die (as well as variations in temperature amongst different dies that include the MOSFETs) can result in different operational characteristics of each of the MOSFETs formed on at least one die. The different electrical operational characteristics of the MOSFET can cause (for example) even greater die temperatures as the $R_{DS\text{-}on}$ increases as the die temperatures rise. If a MOSFET is not thermally protected, the heat can damage or otherwise adversely affect the MOSFET as well as components electrically or thermally coupled to the MOSFET. Also, the increased dissipation of power (e.g., as heat) decreases the power efficiency of the MOSFET. The MOSFET resistance drain-to-source when conducting ($R_{DS\text{-}on}$) increases in response to a rise in temperature. For example, MOSFET currents decreases in response to a temperature rise (and the accompanying rise in the $R_{DS\text{-}on}$), even when the MOSFET gate voltage is held constant.

The lower $R_{DS\text{-}on}$ also can cause larger heat sinks: because the thermal resistance of the thermally coupled packaging is constant, larger amounts of heat buildup can occur when higher voltages or currents are switched. In addition, the lower $R_{DS\text{-}on}$ can affect the yield of the production processes used to generate MOSFETs (e.g., due to difficulties in manufacturing MOSFETs for carrying ever higher current limits).

The heat generated by the $R_{DS\text{-}on}$ limits the amount power switched by a single MOSFET. Dissipating ever-larger amounts of heat generated by the $R_{DS\text{-}on}$ is limited by difficulties in reducing thermal impedances (e.g., of the MOSFET substrate and heatsink). Paralleling MOSFETs distributes the concentration of heat generated by the $R_{DS\text{-}on}$, which reduces the thermal buildup that would otherwise occur by a single MOSFET switching a same amount of power. Paralleling MOSFETs also reduces output inductances of the power loop, which can reduce ringing associated with higher $R_{DS\text{-}on}$ values and parasitic impedances of the power rails.

The MOSFETs output terminals can be coupled in parallel in a circuit (e.g., in a half-bridge circuit topology) to achieve higher power output levels. However, differences in a local temperature (and the resulting different $R_{DS\text{-}on}$ characteristics) of each of the paralleled MOSFETs can cause even virtually identical MOSFETs to conduct different amounts of currents for a given gate voltage held at a steady state. Moreover, differences in driver propagation delays, gate threshold voltages or transconductance can cause uneven current distribution among paralleled MOSFETs during switching transients. Connecting the output drains of the MOSFETs together can cause larger amounts of currents to be carried by a first MOSFET that is coupled to a second MOSFET, even though the first and second MOSFET can be otherwise virtually identical devices. The larger amounts of currents carried by one of the two MOSFETs can cause operation of a MOSFET outside of the parameters of a "safe operating area" (SOA) and result in possible damage to the MOSFETs.

Inductors can be coupled between the drain terminal of each paralleled MOSFET to normalize (e.g., attempt to equalize) "hold" currents of paralleled MOSFETs during switching transients. However, the inductors: dissipate heat, are relatively large in size, are costly, introduce (e.g., additional) time delays in switching output voltages, and lower the power density of the device that incorporates the paralleled MOSFETs (e.g., as compared to a non-paralleled MOSFETs).

As described herein, the relative switching time of a first MOSFET in a group of paralleled MOSFETs can be controlled in response to an "inter-junction" temperature reference signal. The local temperature delta reference signal for controlling the switching of the first MOSFET can be generated in response to comparing a local temperature signal (e.g., for indicating the temperature of heat generated by a junction of the first MOSFET of a group of paralleled MOSFETs) against a remote temperature reference signal (e.g., for indicating the temperature of heat generated by a junction of at least a second MOSFET, where the second MOSFET is another MOSFET of the group of paralleled MOSFETs). The relative switching time can be controlled by controlling a propagation delay for switching the first MOSFET, such that the first MOSFET is modulated to control its junction temperature in response to the remote temperature reference signal (e.g., and optionally in response to the local temperature signal).

For example, the first MOSFET can be controllably switched to control its junction temperature such that the junction temperature of the first MOSFET is adjusted towards the temperature of the second MOSFET as indicated by the remote temperature reference signal. The delay of the switching of the first MOSFET forces the second MOSFET to initially (e.g., during the delay period) carry more of the load current, such that the first MOSFET dissipates less energy (than otherwise) and the second MOSFET dissipates more energy (than otherwise), such that the differing temperatures of the first and second temperatures is normalized (e.g., urged towards a common temperature, when the first MOSFET is hotter than the second MOSFET).

Also, the first MOSFET can contribute information of its own temperature to the circuitry for generating the remote temperature reference signal, such that the remote temperature reference signal includes temperature information of the first MOSFET. For example, the second MOSFET can include circuitry for generating the remote temperature reference signal, such that the remote temperature signal is generated in response to the temperatures of both the first and second MOSFETs. The local temperature delta reference signal for controlling the switching of the second MOSFET can be generated in response to comparing a local temperature signal (e.g., for indicating the temperature of heat generated by a junction of the second MOSFET) against the remote temperature reference signal (e.g., which is also generated in response to the contributed temperature information of the first MOSFET temperature). Accordingly, the switching of either the first or second MOSFET can be independently delayed, such that its junction temperature of the hotter of the first or second MOSFET is adjusted towards the temperature of the other (e.g., cooler) MOSFET.

Controlling the turn-on propagation delay in response to the local temperature delta reference signal tends to equalize the rates of power dissipation of the paralleled MOSFETs, such that the heat buildup of the paralleled MOSFETs (e.g., which can be formed as separate dies) are controllably maintained in a close temperature range (e.g., which helps ensure each MOSFET carries a like amount of current when the respective dies of both MOSFETs are operating at the same temperature). The temporal alignment of the peak switching currents facilitates maintaining the switching operation for each device in a safe-operating area (e.g., within a limited and safe range of temperatures). Accordingly, a die temperature of a first paralleled MOSFET does not limit the operation of a second paralleled MOSFET (e.g., when the temperature of the second paralleled MOSFET can otherwise rise to higher, but safe, levels).

In accordance with the temperature reference comparison described herein, multiple MOSFETs operating as power switches can be coupled safely in parallel, even when the power switch electrical characteristics of the MOSFETs are not closely matched. Additionally, the paralleled MOSFETs need not be selected in accordance with performance characteristics (which can vary as a result of manufacturing process tolerances from the same manufacturing lot or even from different manufacturing lots).

FIG. 1 is a schematic diagram of an example local temperature delta reference signal-controlled circuit for normalizing temperatures of power switching MOSFETs coupled in parallel. The circuit 100 can reduce (e.g., normalize) temperature variations between each of the paralleled MOSFET dies during operation. For example, the circuit 100 includes MOSFET power switches S10, S12, S14 and S16. The MOSFET power switches S10, S12, S14 and S16 can each be formed on respective dies 161, 162, 163 and 164, where the respective dies can be thermally coupled to at least one heatsink.

The high-side pair of MOSFET power switches S10 and S14 are high-side switches that are generally coupled in parallel in a bridge circuit topology, while the low-side pair of MOSFET power switches S12 and S16 are low-side switches that are also generally coupled in parallel in a bridge circuit topology. The high-side switches are coupled between a positive voltage bus PVDO and the switched circuit node SW, and the low-side switches are coupled between a local circuit ground PGND and the switched circuit node SW.

The output terminals of the power switches S10 and S14 are coupled in parallel and the output terminals of the power switches S12 and S16 are also coupled in parallel. The output terminals of the power switches S10 and S14 are coupled in parallel and the output terminals of the power switches S12 and S16 are also coupled in parallel such that (for example) larger amounts of power are switchable than otherwise possible when switched by only one high-side power switch and low-side power switch. Although the power switches are coupled as pairs, each of the power switches S10, S12, S14, and S16 is individually controlled in response to (at least) a local temperature associated with a paired switch: for example, the high-side switch S10 can be switched in response to the local temperature of the high-side switch S14; the high-side switch S14 can be switched in response to the local temperature of the high-side switch S10; the low-side switch S12 can be switched in response to the local temperature of the low-side switch S16; and the low-side switch S16 can be switched in response to the local temperature of the low-side switch S12. The source and drain pins of a first power switch (e.g., S10) can each be coupled (e.g., connected) to the respective source and drain pins of a second power switch (e.g., S14) without intervening passive components (e.g., inductors) coupled therebetween (e.g., such that size, cost, power dissipation, and propagation delays of the intervening components are avoided).

The term "power switches coupled in parallel" can mean a first pair of a series-coupled high- and low-side power switches coupled in parallel arrangement with a respective second pair of a series-coupled high- and low-side power switches, where the first and second high-side power switches are coupled to a high-side power rail, where the first and second low-side power switches are coupled to a low-side power rail, and both pairs of series-coupled high- and low-side power switches are coupled to a switching node, at which a potential is generated that is between the high-side power rail and the low-side power rail.

A pulse-width modulated high-side signal (PWM-HS) is coupled to a first power switching delay circuit 141 and a second power switching delay circuit 143. The first power switching delay circuit 141 and the second power switching delay circuit 143 generate respective delayed PWM signals that are coupled to respective gate (e.g., control) terminals of the high-side MOSFET power switches S10 and S14. A pulse-width modulated low-side (PWM-LS) signal is coupled to a third power switching delay circuit 142 and a fourth power switching delay circuit 144. The third power switching delay circuit 142 and the fourth power switching delay circuit 144 generate respective delayed PWM signals that are coupled to respective gate terminals of the low-side MOSFET power switches S12 and S16.

After the pulse-width modulated high-side signal is asserted, the high-side MOSFET power switches S10 and S14 are activated (e.g., by establishing a conduction channel) in response to the assertion of the pulse-width modulated high-side signal, wherein at least one of the MOSFET power switches S10 and S14 is also activated in response to a respective power switching delay circuit. The low-side MOSFET power switches S12 and S16 are activated in a similar manner, albeit in response to low-side control signals and arrangements.

A PMW block 195 is arranged to generate the high-side pulse width modulation signal for controlling the high-side power switches S10 and S14 in response to the bus SW. The PWM block 195 can alternatively be arranged to control the high-side power switches S10 and S14 (and/or the low-side power switches S12 and S16) in response to a system operating parameter, such as an output voltage of a resistive load powered by the circuit 100. The PMW block 195 is arranged generate the low-side pulse width modulation signal for controlling the low-side power switches S12 and S16 in response to the bus SW. The PMW block 195 can be powered by the power rails PVDO and PGND. In various examples, the PWM block 195 can be a processor, such as a microcontroller or a digital signal processor (DSP).

Temperature-sensing elements 151, 152, 153 and 154 are thermally coupled respectively to the MOSFET power switches S10, S12, S14 and S16. The temperature-sensing elements 151, 152, 153 and 154 can be formed (e.g., formed adjacent to) within the same substrate (e.g., die) as the temperature sensing elements or can be arranged on a multi-chip module adjacent to a component (e.g., chip including a MOSFET switch to be monitored) mounted on the multi-chip module. The temperature-sensing elements can be located virtually anywhere on a die or a multi-chip module where the temperature-sensing elements are thermally coupled to a respective MOSFET. Closer arrangements of the temperature-sensing elements to respective MOSFETs reduce the time of thermal propagation from a MOSFET to a temperature-sensing element, such that the speed of the thermal control loop is increased and better regulation is achieved. Also, each temperature-sensing element can be arranged (e.g., formed or placed) adjacent to a respective MOSFET to provide thermal isolation from other heat sources (such as temperature-regulated MOSFETs being monitored by other temperature-sensing elements. The close arrangements of each MOSFET/temperature-sensing element pair provides thermal isolation from other heat sources because of the longer distances over which the heat from other sources propagates and is dissipated.

In one example, the temperature-sensing elements 151, 152, 153 and 154 can be arranged on the same die(s) upon which each respective MOSFET power switch S10, S12, S14 and S16 is arranged. In another example, the temperature-sensing elements 151, 152, 153 and 154 can be arranged on a multi-chip module upon which each respective MOSFET power switch S10, S12, S14 and S16 are carried. The temperature-sensing elements 151, 152, 153 and 154 are thermally coupled to respective MOSFET power switches S10, S12, S14 and S16, such that latencies of the control loops including the MOSFET power switches S10, S12, S14 and S16 are reduced. For example, the temperature-sensing elements 151, 152, 153 and 154 can each be thermally coupled to a respective MOSFET power switches S10, S12, S14 or S16 by being arranged on the same die as, or by being closely arranged to a heat sink on which the respective MOSFET is mounted. An example of a temperature sensing element (such as 151, 152, 153, or 154) is described below with respect to FIG. 2.

The temperature-sensing elements 151, 152, 153 and 154 are arranged (e.g., placed) to generate respective local temperature signals 171, 172, 173 and 174, such that each signal indicates a sensed die temperature for a respective MOSFET power switch S10, S12, S14 or S16. The die temperature signals 171, 172, 173 and 174 are coupled to inverting input terminals of a respective operational amplifier 131, 132, 133 and 134. A global temperature signal is generated for each of the high-side and low-side circuits, such that a global temperature signal is generated in response to temperature indications of at least two switches of each of the high and low sides.

Each respective global temperature signal is coupled to a non-inverting input terminal of a respective operational amplifier 131, 132, 133 and 134. For example, a global temperature high-side (GLOBAL TEMP HS) signal is coupled to operational amplifiers 131 and 133, and a global temperature low-side (GLOBAL'TEMP LS) signal is coupled to operational amplifiers 132 and 134. As described below with respect to FIG. 2, a global temperature signal is generated in response to local die temperatures of the circuitry coupled to a respective (e.g., high-side or low-side) global temperature node.

Each of the operational amplifiers 131, 132, 133 and 134 is arranged to generate a respective local temperature delta reference signal 181, 182, 183 and 184 in response to the respective global temperature signal and the local temperature signal. Each respective local temperature delta reference signal 181, 182, 183 and 184 is coupled to a respective input terminal of the power switching delay circuits 141, 142, 143 and 144. The power switching delay circuits 141, 142, 143 and 144 are analog circuits in which each power switching delay circuit is configured to delay a respective pulse-width modulated signal (PWM-HS or PWM-LS signal) in response to a respective local temperature delta reference signal 181, 182, 183 and 184. An analog power switching delay circuit (e.g., of a power switching delay circuit 141, 142, 143, or 144) is described below with reference to FIG. 3.

The control circuitry (e.g., one of 191, 192, 193, and 194) each includes a feedback loop that includes a power switching delay circuit (e.g., 141, 142, 143, or 144, respectively), a power switch (e.g., S10, S12, S14, or S16, respectively), a temperature-sensing element (e.g., 151, 152, 153, or 154, respectively), and an operational amplifier (e.g., 131, 132, 133, or 134, respectively). The control circuitry (e.g., one of 191, 192, 193, and 194) can be included on the same die (e.g., 161, 162, 163, or 164, respectively) of the power switch being controlled (e.g., S10, S12, S14, or S16, respectively). The inclusion of the control circuitry on the same die as the power switch being thermally controlled can provide a more accurate temperature measurement of the junction of the power switch (e.g., by avoiding noise and parasitic delays otherwise encountered by routing signals externally), which can improve the quality of the temperature regulation.

In other examples, multiple power switches can be included on a single die. For example, the high-side power switches S10 and S14 can be included on a first die that includes control circuitry 191 and 193, and the low-side power switches S12 and S16 can be included on a second die that includes control circuitry 192 and 194. In another example, the control circuitry 191, 192, 193, and 194 can be included on a single die.

The substrate for each of the control circuitry 191, 192, 193, and 194 also can include a timing capacitor C31 (described hereinbelow with respect to FIG. 3) for generating the PWM delay. Including the timing capacitor C31 on a same substrate (e.g., die) substantially maintains the temperature of the timing capacitor C31 at the die temperature, which is periodically charged with a current generated in response to the local temperature delta reference signal and the PWM signal.

Figure 2:
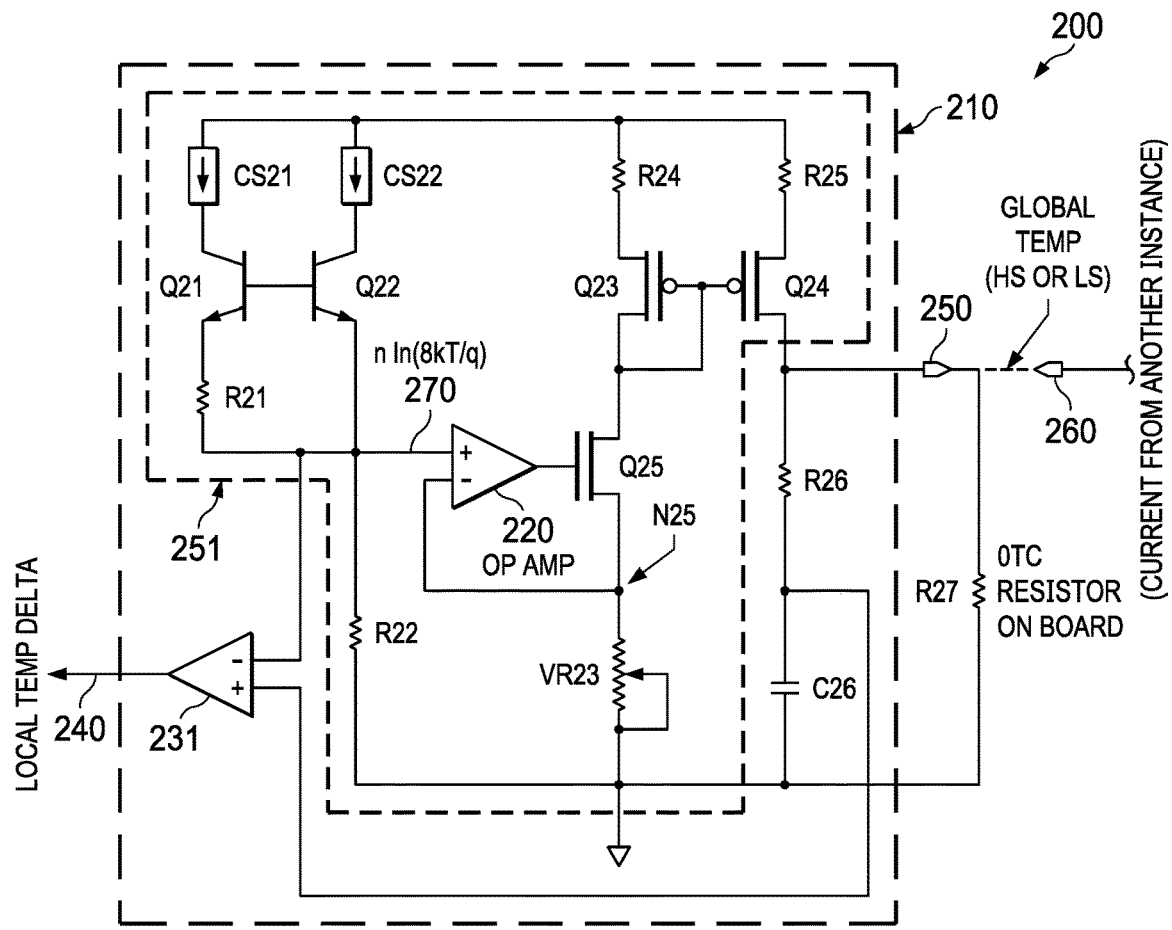
FIG. 2 is a schematic diagram of an example local temperature delta reference generator circuit.

FIG. 2 is a schematic diagram of an example local temperature delta reference generator circuit. The local temperature delta reference generator circuit 200 is an example of one of the temperature-sensing elements 151, 152, 153, and 154 and their respective comparators 131, 132, 133 and 134 of the respective dies 161, 162, 163, and 164, as described hereinabove with reference to FIG. 1. The reference generator circuit 200 includes a temperature-sensing element 251 (which is a temperature-sensing element such as elements 151, 152, 153, and 154) coupled to control a respective operational amplifier 231 (which is an operational amplifier such as amplifiers 131, 132, 133, and 134).

Generally described, the reference generator circuit 200 is arranged to generate a local temperature delta reference signal in response to (e.g., a comparison between) a local temperature signal (e.g., the voltage-proportional-to-absolute-temperature signal locally generated at node 270) and a global (e.g., averaged) temperature reference signal (e.g., generated in response to combining temperature indications of a first power switch and at least one other power switch).

In operation, the reference generator circuit 200 is thermally coupled to a die of a power switch, such as one die (e.g., 161, 162, 163 or 164) of the example power switches S10, S12, S14 and S16 shown in FIG. 1. The temperature-sensing element 251 of the reference generator circuit 200 can be thermally coupled to a die of a power switch by forming the temperature-sensing element 251 on the same substrate (e.g., silicon substrate) as the power switch or by closely arranging the temperature-sensing element 251 and the thermally controlled power switch on a heatsink.

For example, the closely spaced arrangement (e.g., of the temperature-sensing element 251 being situated near to the power switch that is controlled by the temperature-sensing element 251) can minimize thermal interference from switching heat generated by other power-switches. Minimizing the thermal interference reduces the influence of temperature variations caused by other power switches upon the control loop of a particular power switch being controlled in response to the temperature-sensing element 251. Accordingly, the particular power switch is thermally controlled in response a local temperature signal (e.g., at node 270), which primarily indicates the heat being dissipated by the particular power switch.

The reference generator circuit 200 for thermally controlling a first power switch can be mounted on a same or different substrate 210 for arranging other instances of the reference generator circuit 200 for thermally controlling other power switches. In various examples, the substrate can be a multi-chip module, or an integrated die including at least two power switches. As described hereinabove, the temperature-sensing element 251 is arranged in close proximity to the power switch being thermally controlled, which minimizes thermal resistance between the temperature-sensing element 251 and respective power switch (e.g., being thermally controlled).

The temperature-sensing element 251 includes matched current sources CS21 and CS22 that are coupled to a power source input, such as a regulated voltage around 5 volts higher than node SW (e.g., shown in FIG. 1). The outputs of current sources CS21 and CS22 are each coupled respectively to respective collectors of bipolar transistors Q21 and Q22.

The bipolar transistors Q21 and Q22 (e.g., for generating a temperature-proportion signal) are mounted on a die close to (or formed on) the power switch being controlled, such that the bipolar transistors Q21 and Q22 are thermally coupled to an associated power switch. The bipolar transistors Q21 and Q22 are thermally coupled to the associated power switch, such that the junction temperatures of the bipolar transistors Q21 and Q22 are developed (e.g., developed in greater part) in response to the temperature of the associated power switch. The bipolar transistors Q21 and Q22 are coupled to a voltage divider (e.g., resistors R21 and R22 in series). The voltage divider and the bipolar transistors Q21 and Q22 are arranged as a silicon bandgap temperature sensor for generating a localized temperature dependent voltage (e.g., local temperature signal) at the circuit node 270.

The junction temperatures of bipolar transistors Q21 and Q22 are characterized in accordance with a negative temperature coefficient. The bipolar transistors Q21 and Q22 are arranged to conduct currents of different current densities therebetween. Each transistor Q21 and Q22 generates a respective emitter voltages that are scaled (e.g., divided) by the voltage divider (formed by resistors R21 and R22) to generate a voltage-proportional-to-absolute-temperature signal (e.g., as the local temperature signal at the circuit node 270). The voltage-proportional-to-absolute-temperature (VPTAT) signal generally indicates (e.g., conveys) the local die temperature developed by the associated power switch (e.g., more specifically, the VPTAT signal indicates the junction temperature of bipolar transistors Q21 and Q22, which in turn is thermally coupled to the associated power switch).

The local temperature signal at circuit node 270 is scaled by the operational amplifier 231 to generate a local temperature delta reference signal, which is coupled to control a delay of a switching signal (e.g., PWM-HS or PWM-LS of FIG. 1) for switching the associated power switch (e.g., one of the high-side switches S10 or S14, or one of the low-side switches S12 or S16). The local temperature signal of node 270 is scaled by the operational amplifier 231 in response to a comparison between the local temperature signal of node 270 and a global (e.g., combined) temperature reference signal (e.g., generated in response to the coupling of nodes 250 and 260) that is generated in response to a temperature of at least one other power switch.

A high-side global temperature reference signal can be generated by summing (e.g., combining) a first current from a first reference generator circuit 200 instance (that is one of the high side instances) with a second current input from a second reference generator circuit 200 instance (that is a different one of the high-side instances). The first current is developed in response to the node 270 voltage of a first high-side temperature-sensing element (e.g., of temperature-sensing element 151), whereas the second current is developed in response to the node 270 voltage of a second high-side temperature-sensing element (e.g., of temperature-sensing element 153).

A low-side global temperature reference signal can be generated by summing (e.g., combining) a first current from a first reference generator circuit 200 instance (that is one of the low side instances) with a second current input from a second reference generator circuit 200 instance (that is a different one of the high-side instances). The first current is developed in response to the node 270 voltage of a first low-side temperature-sensing element (e.g., of temperature-sensing element 152), whereas the second current is developed in response to the node 270 voltage of a second low-side temperature-sensing element (e.g., of temperature-sensing element 154).

The local temperature dependent voltage at node 270 is buffered by the operational amplifier 220 to drive the gate of transistor Q25, such that the source-drain current of transistor Q25 is controlled in response to the local temperature signal of node 270. The source-drain current is coupled via the variable resistor VR23 to ground, such that a voltage dependent on the variable resistor VR23 is developed at node N25. The node N25 voltage controls the buffering of the operation amplifier 220, such that the gain of transistor Q25 is controllable in response to the setting of variable resistor VR23. An example implementation (and the "trimming" thereof) of a variable resistor VR23 is described hereinbelow with respect to FIG. 6.

Accordingly, a current mirror control voltage is developed at the drain of transistor Q25 in response to the voltage developed at node N25 (e.g., the source of transistor Q25). The current mirror control voltage is coupled to the gates of the transistors Q23 and Q24, which are cooperatively arranged as a current mirror in which the current flowing through the transistor Q23 is mirrored by the transistor Q24 (where each of the mirrored currents are limited by the respective series resistors R24 and R25).

The mirrored current generated at the drain of Q24 is summed at node 250 (e.g., in an open-drain arrangement) with current from a node 260, which is the node "250" of at least one other instance (e.g., of a corresponding high-side or low-side instance) of another reference generator circuit 200. A voltage at node 250 for indicating the global voltage is developed in response to the summed current being coupled to the resistor RST and a low-pass filter (e.g., formed by the series arrangement of R26 and C26). Capacitor C26 integrates the global temperature reference signal to (for example) decouple high-frequency switching noise from the low-frequency temperature information (and by shunting the high-frequency energy to ground). The relatively high input impedance of the operational amplifier 231 (to which the center node of the low-pass filter is coupled) also impedes the low-frequency current flowing through the resistor R26, which in turn minimizes the effect of R26 temperature fluctuations on the low frequency components of the global temperature signal.

The tolerance of the resistor R26 can be relatively low (e.g., less than 1 percent), which can increase accuracy in resistance (e.g., to help minimize thermal fluctuations of R26). The low (e.g., less than 100 ppm per degree C.) temperature coefficient ("OTC") resistor R27 in comparison is relatively stable over changes in temperature. The "OTC" resistor R27 can be arranged as a single resistor on a system board shared by other reference generator circuit 200 coupled thereto.

The operational amplifier 231 is arranged to amplify (e.g., with a gain of 200) the difference between the localized temperature dependent voltage at node 270 and the voltage of the global temperature reference signal to generate a local temperature delta reference signal. Accordingly, a high-side global temperature reference signal can be generated by coupling currents from the drain of the Q24 of each of at least two high-side reference generator circuits 200, and a low-side global temperature reference signal can be generated by coupling currents from the drain of the Q24 of each of at least two low-side reference generator circuits 200.

In another example, a two-dimensional electron gas resistor can be used to generate the VPTAT signal at node 270. For example, a two-dimensional electron gas (2DEG) resistor can be formed directly on the die (e.g., substrate) of the associated power switch, where the die can be formed of a gallium nitride material. In operation, the resistance of the 2DEG resistor varies over temperature (e.g., in accordance with a temperature coefficient of 8500 parts-per-million per degree Celsius), such that the voltage developed across the 2DEG resistor is a high-resolution VPTAT signal. The high-resolution VPTAT signal can be coupled to generate the global temperature signal, and also can be coupled as a local temperature signal as an input to the operational amplifier 231 (e.g., which generates the local temperature delta reference signal in response to a comparison of the global temperature signal and the local temperature signal).

Figure 3:
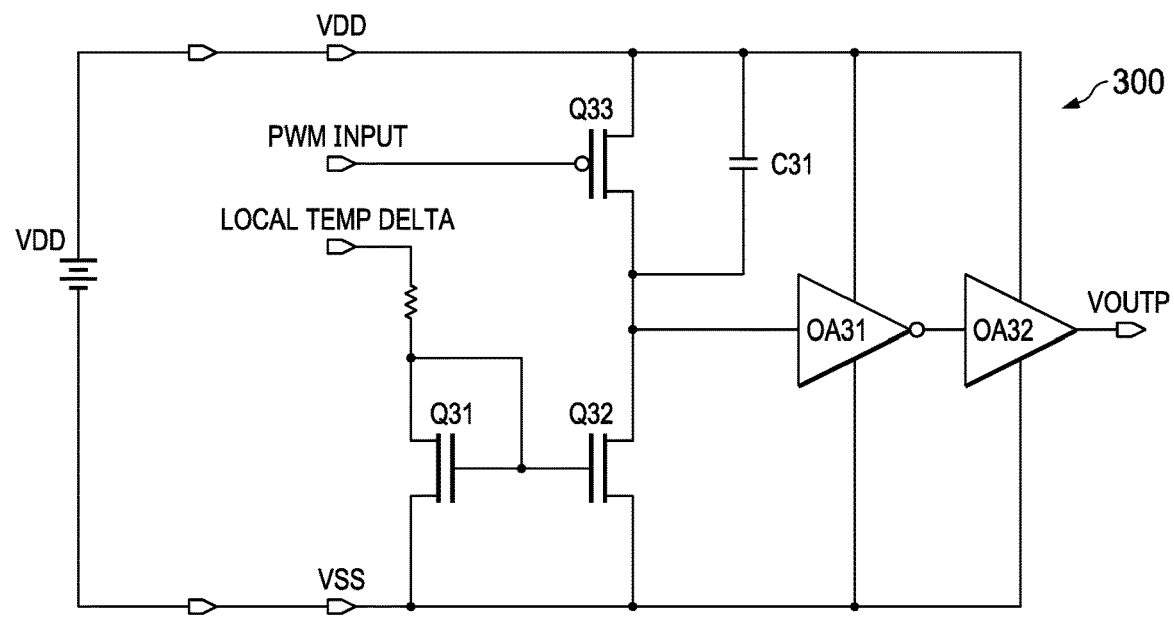
FIG. 3 is a schematic diagram of an example power switching delay circuit.

FIG. 3 is a schematic diagram of an example power switching delay circuit. The power switching delay circuit 300 is an example circuit such as one of the power switching delay circuits 141, 142, 143 and 144 described hereinabove with reference to FIG. 1. The power switching delay circuit 300 is arranged to generate a delayed power switching control signal in response to a local temperature delta reference signal (which is generated in response to temperature indications of at least two power switches).

For example, the power switching delay circuit 300 is arranged to receive a switching control signal (PWM input, such as the PWM-HS or PWM-LS input signal, described hereinabove with respect to FIG. 1) for switching the local power switch and, in response, to generate the delayed switching control output signal. The power switching delay circuit 300 is arranged to receive the PWM input signal at the "PWM input" node, delay the PWM in response to the local temperature delta reference signal, and to output the delayed PWM input signal as the amplified voltage output PWM signal VOUTP.

In operation, a current mirror (which includes the commonly controlled N-type transistors Q31 and Q32) is arranged to generate a mirrored current in response to local temperature delta reference signal. For example, the local temperature delta reference signal generates a current through the transistor Q31 proportional to the transconductance of the transistor Q31, such that the current flowing through the transistor Q31 is inversely proportional to the temperature difference between the thermally controlled switch and the global temperature signal. The current flowing through transistor Q32 is also controlled in response to the local temperature delta reference signal (e.g., because the gates of transistor Q32 and Q31 are commonly coupled).

The current (e.g., mirrored current) flowing through transistor Q32 is coupled from transistor Q33 and capacitor C31. The transistor Q33 is arranged to charge the capacitor C31 in response to the PWM input signal, whereas the current controlled by transistor Q33 controls the discharging period of the capacitor C31. For example, a low value asserted on the PWM input signal activates the transistor Q33, such that VDD is coupled to both terminals of capacitor C31 (which charges capacitor C31). Accordingly, the transistor Q33 inverts the asserted PWM input and raises the Q33 drain voltage to a high level (above the switching threshold) of the inverting amplifier OA31. When the value asserted on the PWM input signal is toggled high, the transistor Q33 is deactivated, such that the controlled current flowing through transistor Q32 discharges the capacitor C31 in response to the local temperature delta reference signal. The controlled discharging of the capacitor C31 introduces a delay in the propagation of the rising edge of the PWM input signal because of the time period for discharging the capacitor C31 to a voltage below the switching threshold of the inverting amplifier OA31.

In response to an input above the switching threshold of the inverting amplifier OA31, the inverting amplifier outputs a low level signal (e.g., below the switching threshold of the amplifier OA32), such that the logic input of the amplifier OA32 is low. Accordingly, the double inversion of the logic restores the output logic to the same logic levels of the input signal. When the input of the amplifier OA32 is low, the output of the (e.g., non-inverting) amplifier is also low.

In response to an input (e.g., as delayed by the discharging of C31) falling below the switching threshold of the inverting amplifier OA31, the inverting amplifier OA31 outputs a high level signal (e.g., above the switching threshold of the amplifier OA32), such that the logic input of the amplifier OA32 is high. When the input of the amplifier OA32 is high, the amplifier OA32 asserts the (e.g., amplified) delayed power switching control signal (e.g., at node VOUTP).

The delayed power switching control signal is coupled to the control gate of the power switch (such as S10, S12, S14, or S14) that is being monitored for temperature. Accordingly, the local power switch is switched in response to a (e.g., locally monitored) temperature indication of a first (e.g., local) power switch and in response to a (e.g., remotely monitored) temperature indication of a second (e.g., distant) power switch, where the first and second power switches include output terminals that are coupled in parallel.

Figure 4:
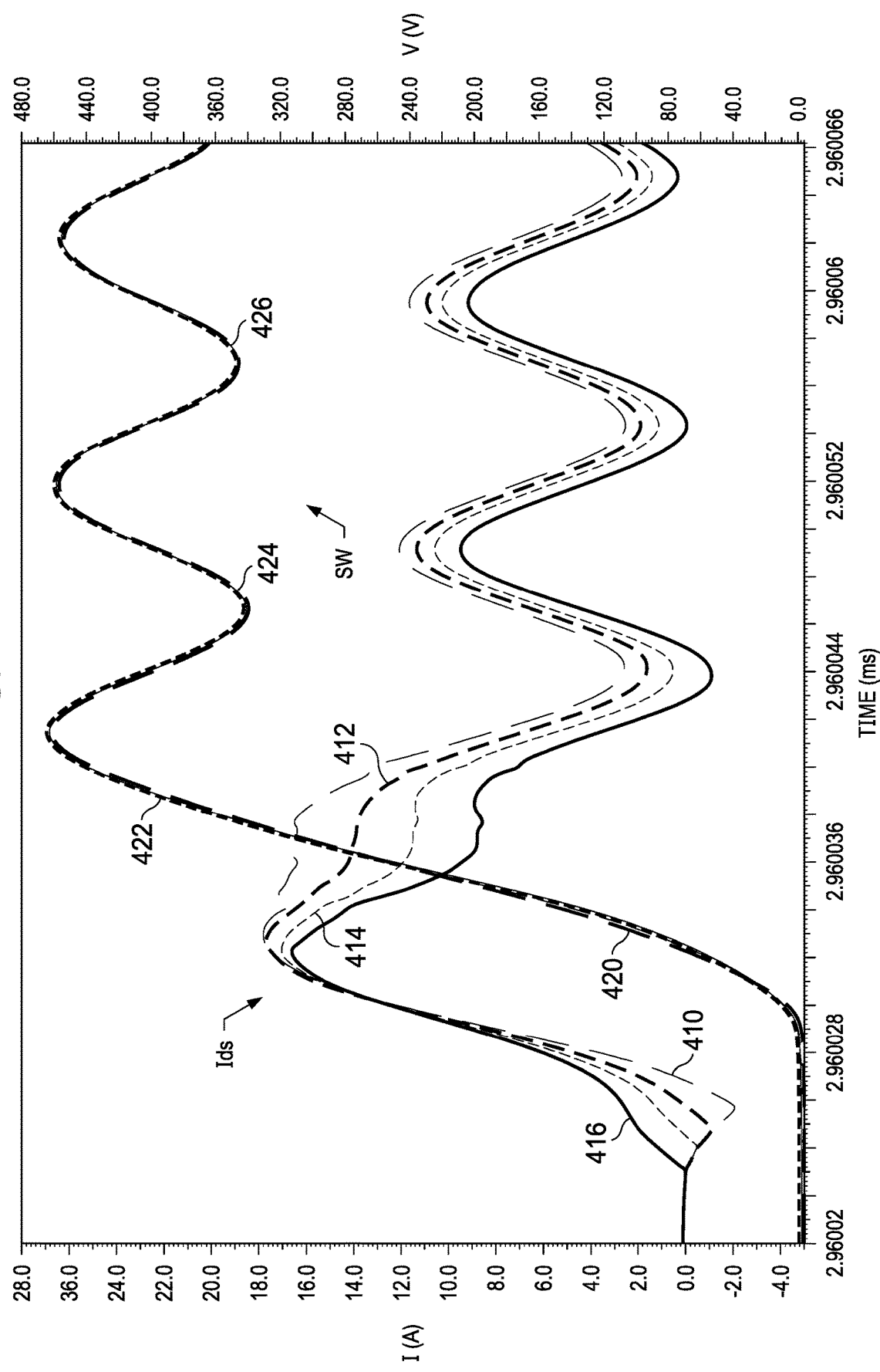
FIG. 4 is a waveform diagram showing simulated output waveforms of an example local temperature delta reference signal-controlled circuit.

FIG. 4 is a waveform diagram showing simulated output waveforms of an example local temperature delta reference signal-controlled circuit. For example, waveforms 410, 412, 414 and 416 are the output currents (e.g., coupled to the switching node) of respective local temperature delta reference signal-controlled circuits, whereas the waveforms 420, 422, 424, and 426 are each a voltage drain-to-source (e.g., coupled to the switching node) of the respective local temperature delta reference signal-controlled circuit. The waveforms 410, 414, 420, and 424 are associated with the high-side power switches S10 and S14 (which include output terminals coupled in parallel to the bus SW as shown in FIG. 1). The waveforms 412, 416, 422, and 424 are associated with the low-side power switches S12 and S16 (which also include output terminals coupled in parallel to the bus SW as shown in FIG. 1). The horizontal axis of the plot is a time axis in milliseconds.

The voltage scale in volts for the waveforms 420, 422, 424 and 426 is shown to the right side of the waveform diagram. As shown, each of the waveforms 420, 422, 424 and 426 includes power loop oscillations of the voltage on the bus SW. Because the four MOSFET power switches S10, S12, S14 and S16 are coupled (e.g., connected) at node SW, the waveforms 420, 422, 424 and 426 have respective, nearly identical voltages over time.

The current scale in amperes for the waveforms 410, 412, 414 and 416 is shown on the left side of the plot. The waveforms 410, 412, 414 and 416 are each a drain current of each of the respective MOSFET power switches S10, S12, S14 and S16. When the output pins of S10 and S14 are mutually wire-connected (e.g., such that the resistance therebetween is mostly caused by coupling wires, rather than being caused by resistors or inductors coupled between S10 and S14) and the output pins of S12 and S16 are mutually wire-connected, the difference in current supplied by the mutually coupled switches of each pair of switches indicates the switch carrying more current generates more heat than the heat generated by the other switch (e.g., which carries less current).

In the simulation, different values were assigned to selected characteristics of the power switches, such that the simulation model introduces variations that can naturally occur when manufacturing power switches. Because the simulation includes modeling the closed loop feedback system of the local temperature delta reference signal controls, the temperatures of the different dies are urged to converge upon a commonly targeted temperature level (e.g., as indicated by the global temperature signal). The commonly targeted temperature level continuously varies over time (e.g., in response to a PWM generator), such that the temperature each of the power switches is continually being controlled in response to dynamic conditions, and such that the global temperature signal continually varies.

In the illustrated simulation, for a given set of operating parameters operating in the closed loop feedback system of the local temperature delta reference signal controls described herein, the current difference between the highest and lowest currents of any of the different power switches is around 3.8 amperes (at around 2.960044 milliseconds, which is a point in the simulation after the thermally-based closed-loop regulation starts to cause convergence of each of the output currents).

In a comparison simulation, for the given set of operating parameters operating in an open loop feedback system (e.g., without the local temperature delta reference signal controls described herein), the current difference between the highest and lowest currents of any of the different power switches is around 13.8 amperes (at around 2.960044 milliseconds, which is around 10 amperes more than the resulting currents of the closed loop simulation). The greater currents in the open-loop configuration for a given regulated output voltage cause higher power dissipation (e.g., than the described closed-loop configuration simulation) and larger heat buildup due to thermal impedance.

Figure 5:
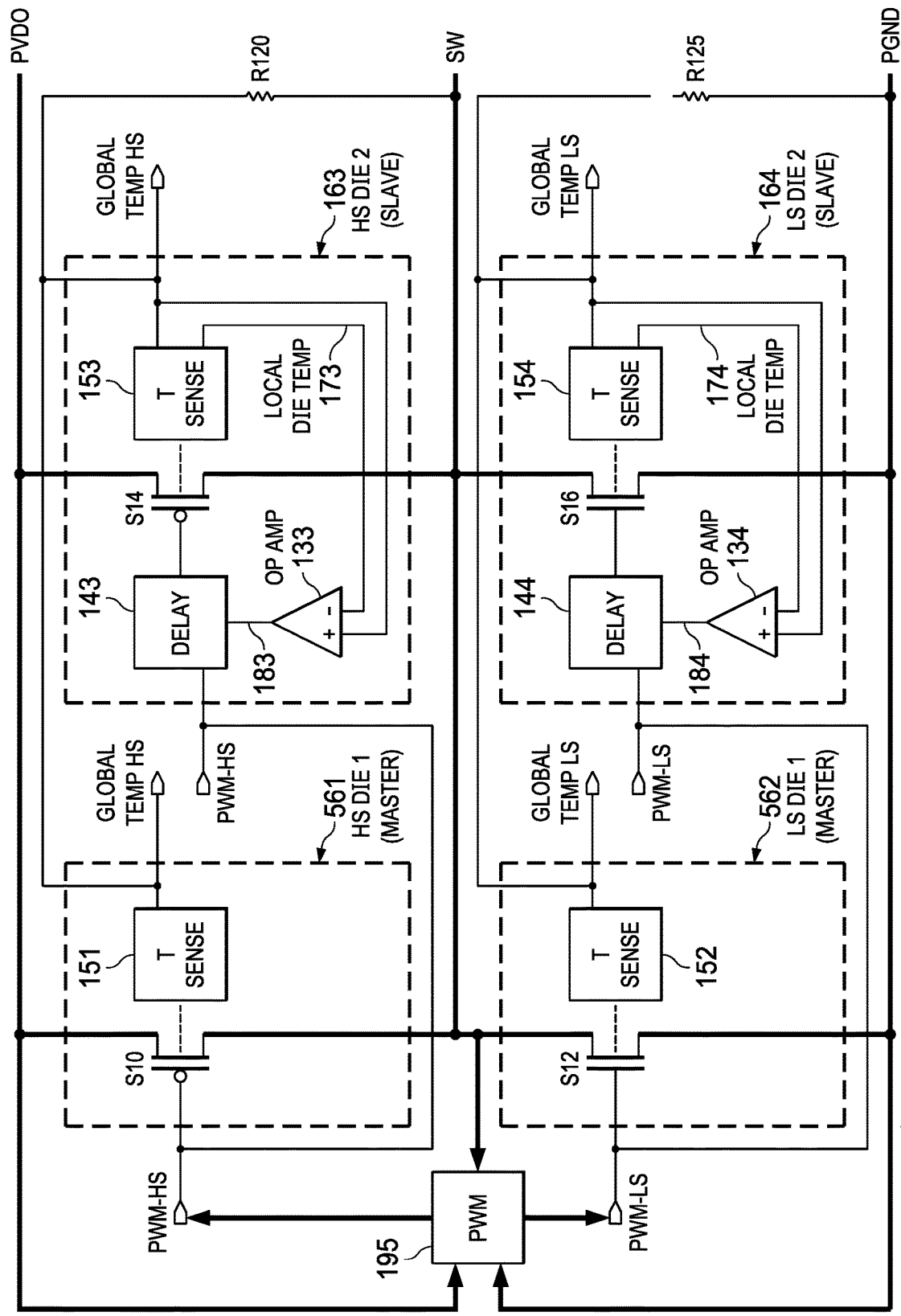
FIG. 5 is a schematic diagram of an example master/slave local temperature delta reference signal-controlled circuit for normalizing temperatures of power switching MOSFETs coupled in parallel.

FIG. 5 is a schematic diagram of an example master/slave local temperature delta reference signal-controlled circuit. The example circuit 500 can also increase switching efficiency by normalizing temperatures of power switching MOSFETs coupled in parallel during operation.

For example, the master high-side die 561 (HS DIE 1) is arranged to generate a high-side global temperature reference signal (GLOBAL TEMP HS) in cooperation with the slave high-side die 163 (HS DIE 2). The slave high-side die 163 is arranged to normalize (e.g., to bring closer together) its temperature in response to the indication of temperature from the temperature-sensing element 151 (where the indication of temperature from the temperature-sensing element 151 is coupled to generate the high-side global temperature reference signal). In contrast, the master high-side die 561 in not arranged to directly self-normalize its own temperatures with the slave high-side die 163, but instead the temperatures of the master high-side die 561 are normalized passively (e.g., to be brought closer together) by the temperature compensation circuit of the slave high-side die 163 (e.g., which includes the closed feedback loop formed by the arrangement of the power switching delay circuit 143, power switch S14, temperature-sensing element 153, and operational amplifier 133).

In a similar manner, the master low-side die 562 (LS DIE 1) is arranged to generate a low-side global temperature reference signal (GLOBAL TEMP LS) in cooperation with the slave low-side die 164 (LS DIE 2). The slave low-side die 164 is arranged to normalize its temperature in response to the indication of temperature from the temperature-sensing element 152 (where the indication of temperature from the temperature-sensing element 152 is coupled to generate the low-side global temperature reference signal). In contrast, the master low-side die 562 in not arranged to directly self-normalize its own temperatures with the slave low-side die 164, but instead the temperatures of the master low-side die 562 are normalized passively by the temperature compensation circuit of the slave low-side die 164 (e.g., which includes the closed feedback loop formed by the arrangement of the power switching delay circuit 143, power switch S14, temperature-sensing element 153, and operational amplifier 133).

Table 1 hereinbelow shows maximum simulation temperatures in degrees Celsius of four paralleled power switches operating in accordance with the configuration shown in FIG. 1 for various open-loop and closed loop simulations. In some simulations the effect of temperature upon the resistance drain-to-source was modeled (as shown in the bottommost rows of TABLE 1), whereas in other simulations the effect of temperature upon the resistance drain-to-source while conducting were not modeled (as shown in the topmost rows of TABLE 1).

TABLE 1

|  | Model Temp Feedback | Die1 | Die2 | Die3 | Die4 |
| --- | --- | --- | --- | --- | --- |
| Open loop | No | 149 | 69 | 96 | 169 |
| Closed loop - Die1 = master | No | 122 | 120 | 122 | 123 |
| Closed loop - Avg temp | No | 122 | 122 | 121 | 122 |
| Open loop | Yes | 181 | 137 | 156 | 192 |
| Closed loop - Avg temp | Yes | 167 | 166 | 166 | 167 |

As shown hereinabove in TABLE 1, the die temperatures are normalized when operating in the closed loop configurations. Additionally, the high temperatures otherwise encountered when operating in open loop conditions are avoided when operating in a closed loop configuration (e.g., for otherwise similar or equal operating conditions).

Figure 6:
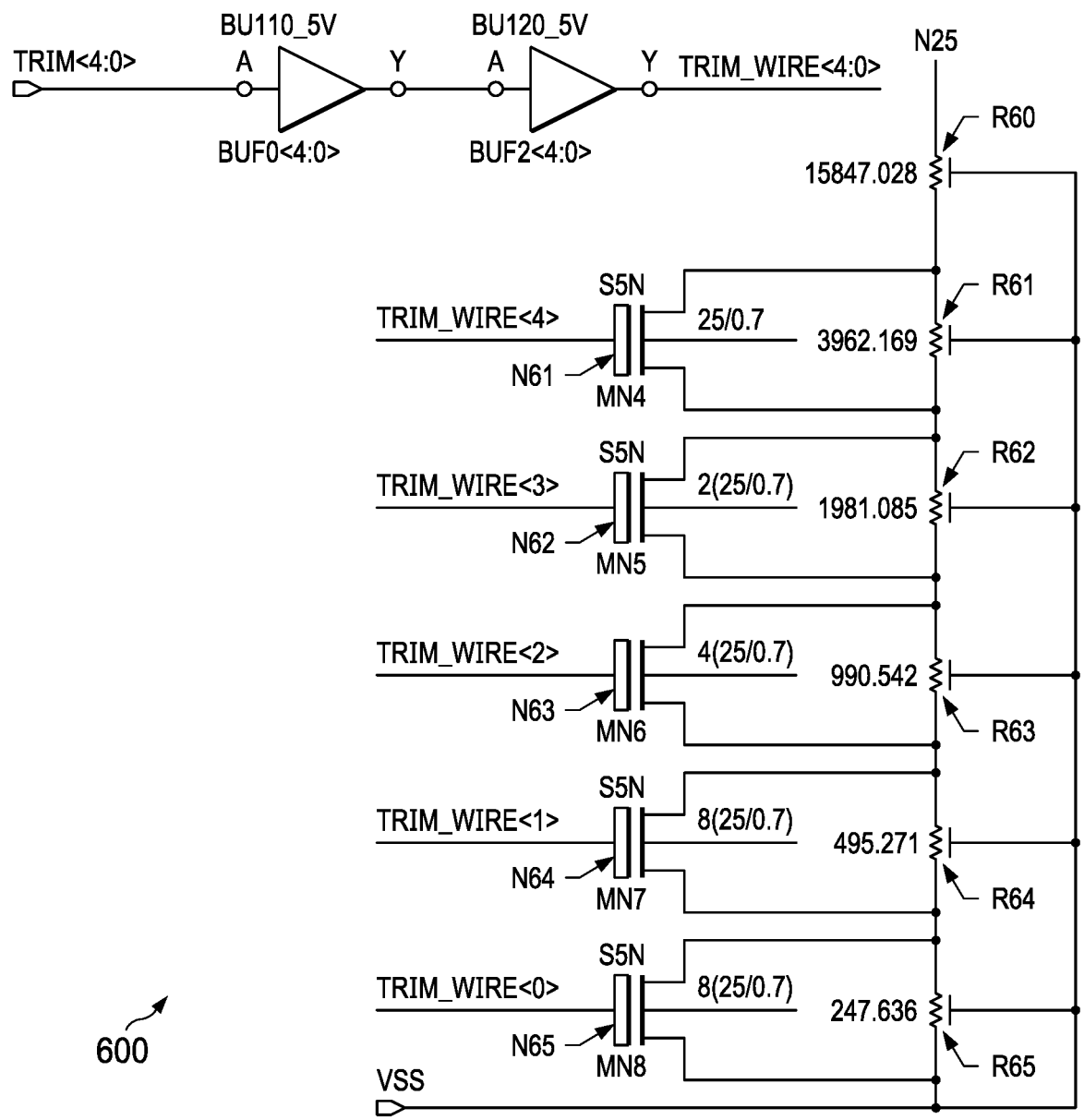
FIG. 6 is a schematic diagram of a programmable variable resistor of an example temperature compensation circuit for parallel power switching.

FIG. 6 is a schematic diagram of a programmable variable resistor of an example temperature compensation circuit for parallel power switching. The programmable variable resistor 600 is a resistor such as the variable resistor VR23 described hereinabove with respect to FIG. 2. The resistor 600 includes (e.g., five instances of) control input buffers BUF0<4:0> and control input buffers BUF0<4:0>, which are arranged to receive an input signal TRIM<4:0> for buffering and to output the signal TRIM WIRE<4:0> for driving the bypass transistors N61, N62, N63, N64, and N65.

The net resistance (e.g., programmed total resistance) of the resistor 600 is selectively controlled in response to the TRIM<4:0>, whose value can be determined in a calibration or during manufacture. The TRIM<4:0> signal can be asserted in response to processor execution of calibration equipment, fuses, switches, and/or wiring.

The bypass transistors N61, N62, N63, N64, and N65 can be non-volatile programmed transistors, such that a programming voltage applied to the gate of a transistor can program the transistor to a conductive (or alternatively, a non-conductive) state in which the programmed state is retained by the transistor after removal of the programming voltage.

In an example, the bypass transistors N61, N62, N63, N64, and N65 are NMOS transistors, programmed by the 5-bit trim signal TRIM<4:0> to selectively bypass any of the resistors R60, R61, R62, R63, R64, and R65. The resistors can have similar or weighted binary values such that a selected net resistance can be programmatically coupled in response to "adding" or "shorting-out" selected members of the resistors R60, R61, R62, R63, R64, and R65. Accordingly, a non-volatile selected resistance can be coupled to the node N25 of FIG. 2 described hereinabove.

Figure 7:
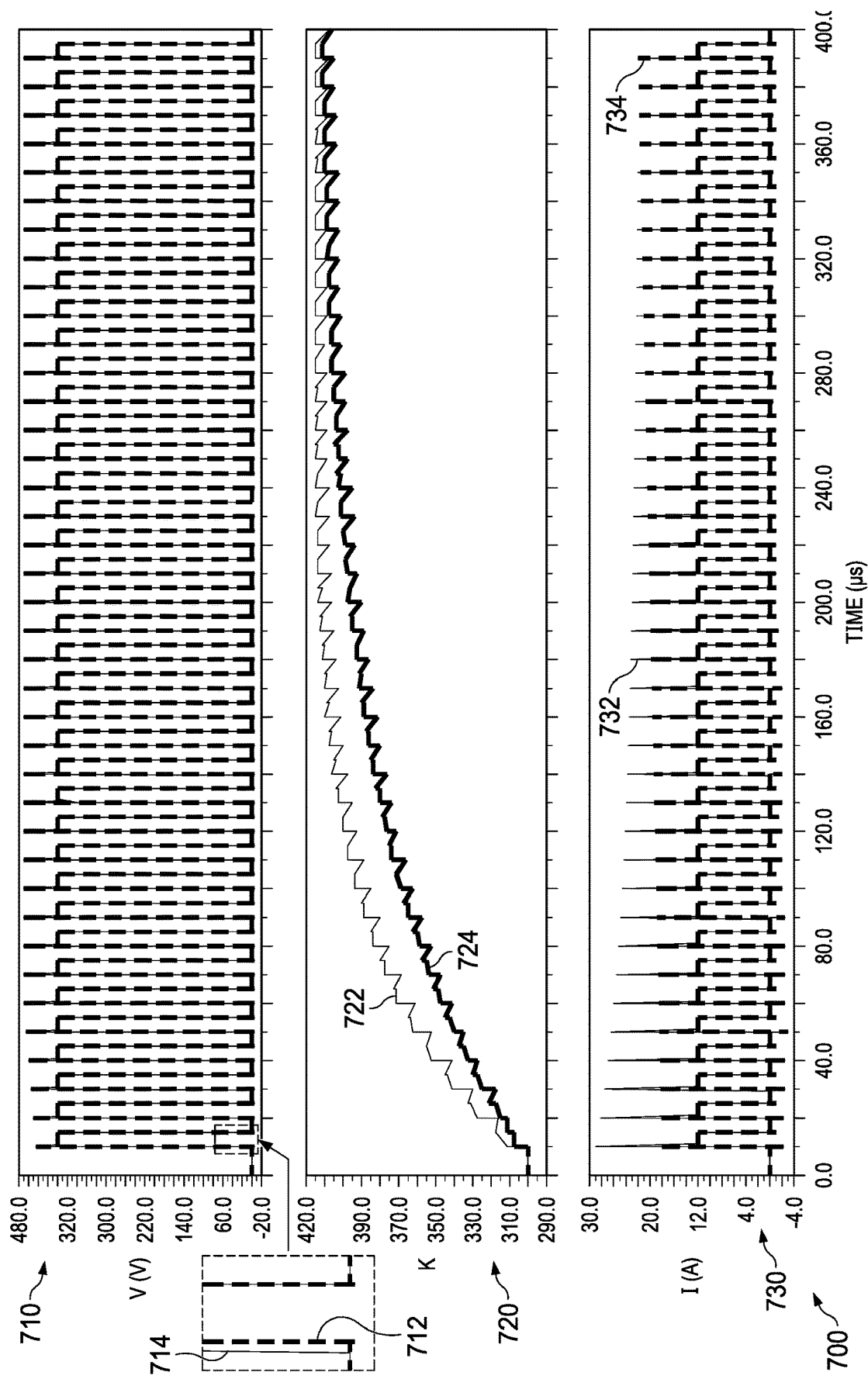
FIG. 7 is a waveform diagram showing simulated output waveforms of an example local temperature delta reference signal controlled circuit operating in a master/slave mode.

FIG. 7 is a waveform diagram showing simulated output waveforms of an example local temperature delta reference signal controlled circuit operating in a master/slave mode. For example, the simulation results 700 show operation of control circuitry (e.g., of slave die 163) for monitoring the temperature of a first die (e.g., master die 561) in a master/slave (respectively) arrangement (e.g., as described hereinabove with respect to FIG. 5). Simulation results 700 are shown as trace 710 (e.g., which includes switching signal waveforms 712 and 714), trace 720 (e.g., which includes switching temperature waveforms 722 and 724), and trace 730 (e.g., which includes output current waveforms 732 and 734).

The trace 710 shows (in volts) the switching waveforms 712 and 714, which are signals for driving switches S10 and S14, respectively. The rising edge of the switching waveform 714 is selectively delayed (e.g., with respect to the rising edge of the switching waveform 712).

For example, the power switching delay circuit (e.g., 300) is arranged to selectively delay the rising edge of the switching waveform 714 (e.g., with respect to the rising edge of the switching waveform 712) in response to the local temperature delta signal. The selected delay of the rising edge of the switching waveform 714 normalizes the junction temperature of the switch S14 towards a temperature indicated by the global temperature signal. The delay of the rising edge causes normalization of the junction temperatures of the switches S10 and S14, which in turn causes the amplitudes of switching peak currents to be normalized (e.g., urged towards a common value).

The trace 720 shows the switching temperature waveforms 722 and 724, each of which indicates a respective switch temperature in degrees K. The switching temperature waveforms 722 and 724 indicate the relative junction temperature of switches S10 and S14, respectively. As the example simulation 700 progresses, similar components (which are modeled in the simulation by using similar but not equal electrical characteristics, e.g., selected in accordance with 10 percent tolerances) display varying characteristics in response to the differences in electrical characteristics between similar components.

For example, the simulation 700 "models" (e.g., accounts for) variations in real components that occur due to manufacturing process variations by assigning similar but not equal values to the similar components as simulation variables. Variations in the mutual switching temperatures of the switches occur due to the varying characteristics, such that differing impedances occur (e.g., as a function of temperature). The changes in impedance cause changes in the amount of currents as the respective temperatures vary. Accordingly, the magnitudes of the currents (e.g., the output current waveforms 732 and 734) switched by switches S10 and S14 vary in accordance with temperature.

As described herein, the power switching delay circuit (e.g., the circuit 300) is arranged to delay the rising edge of the switching waveform 714 with respect to the rising edge of the switching waveform 712 in response to the local temperature delta signal. The delayed rising edge controls a rate of change of temperature, such that the switching temperature waveforms 722 and 724 gradually converge (e.g., in response to the temperature-controlled feedback loop, described hereinabove). The convergence normalizes the temperature of each switch (e.g., switch S10 and S14) towards a common temperature. The switching of the switches S10 and S14 at a common temperature equalizes (for example) the impedance-as-a-function-of-temperature, such that similar amounts of current are switched (at a common point in time) by each of the switches at similar (e.g., nearly equal) temperatures. For example, activation of the power switch S14 can occur after the activation of the power switch S10 by a delay determined in response to a first power switching delay (e.g., determined locally to S14 in response to the local temperature delta signal).

For example, at 10 microseconds into the simulation, the difference in peak switching currents (e.g., of the output current waveforms 732 and 734) is around 10 amperes, which causes a different temperature rise in each of the switches S10 and S14. The temperature feedback loop control circuitry evaluates the resulting temperature differences and determines a delay for the rising edge of the output current waveform 734. The delay in the rising edge of the output current waveform causes the temperature indicated by the switching temperature waveform 724 to change, such that the switching temperature waveforms 722 and 724 converge towards a common (e.g., similar) value.

Figure 8:
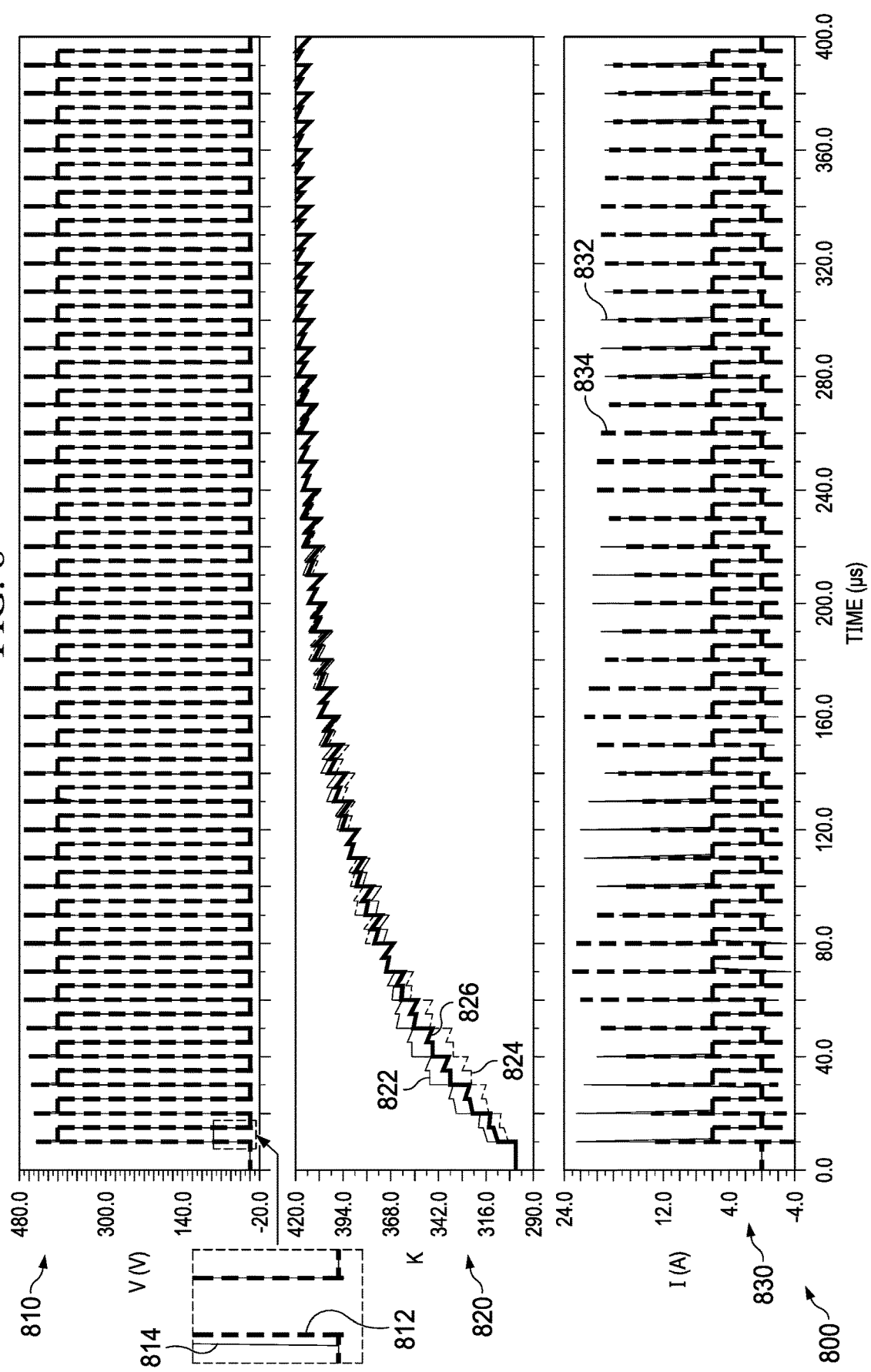
FIG. 8 is a waveform diagram showing simulated output waveforms of an example local temperature delta reference signal controlled circuit operating in a temperature averaging mode.

FIG. 8 is a waveform diagram showing simulated output waveforms of an example local temperature delta reference signal controlled circuit operating in a temperature averaging mode. For example, the simulation results 800 shows operation of control circuitry the temperature of a first die (e.g., die 161) and a second die (e.g., die 163), wherein local die temperatures (e.g., from different dies) are averaged and monitored by control circuitry in a temperature averaging arrangement (e.g., as described hereinabove with respect to FIG. 1). Simulation results 800 are shown as trace 810 (e.g., which includes switching signal waveforms 812 and 814), trace 820 (e.g., which includes switching temperature waveforms 822, 824, and 826), and trace 830 (e.g., which includes output current waveforms 832 and 834).

The trace 810 shows (in volts) the switching waveforms 812 and 814, which are signals for driving switches S10 and S14, respectively. The rising edge of the switching waveform of a first switch (e.g., which is one of S10 and S14) is selectively delayed with respect to the rising edge of the switching waveform of a second switch (e.g., which is one of S10 and S14 that is different from the first switch).

For example, the power switching delay circuit (e.g., 300) is arranged to selectively delay the rising edge of the switching waveform 814 (e.g., with respect to the rising edge of the switching waveform 812) in response to the local temperature delta signal (e.g., when the switch 814 is hotter than the switch 810). The selected delay of the rising edge of the switching waveform 814 normalizes the junction temperature of the switch S14 towards a temperature indicated by the global average temperature signal. The delay of the rising edge of the switching waveform 814 causes normalization of the junction temperatures of the switches S10 and S14, which in turn causes the amplitudes of switching peak currents to be normalized (e.g., urged towards a common value).

In a similar manner, the power switching delay circuit (e.g., 300) is arranged to selectively delay the rising edge of the switching waveform 812 (e.g., with respect to the rising edge of the switching waveform 814) in response to the local temperature delta signal (e.g., when the switch 810 is hotter than the switch 814). The selected delay of the rising edge of the switching waveform 812 normalizes the junction temperature of the switch S10 towards a temperature indicated by the global average temperature signal. The delay of the rising edge of the switching waveform 812 causes normalization of the junction temperatures of the switches S10 and S14, which in turn causes the amplitudes of switching peak currents to be normalized.

The trace 820 shows the switching temperature waveforms 822, 824, and 826. The temperature waveforms 822 and 826 indicate a respective switch (e.g., S10 and S14, respectively) temperature in degrees K, whereas the temperature waveform 826 (e.g., the global temperature waveform) is the average of the temperature waveforms 822 and 826. As the example simulation 800 progresses, similar components (which are modeled in the simulation by using similar but not equal electrical characteristics, e.g., selected in accordance with 10 percent tolerances) display varying characteristics in response to the differences in electrical characteristics between similar components.

For example, the simulation 800 "models" variations in real components that occur due to manufacturing process variations by assigning similar but not equal values to the similar components as simulation variables. Variations in the mutual switching temperatures of the switches occur due to the varying characteristics, such that differing impedances occur (e.g., as a function of temperature). The changes in impedance cause changes in the amount of currents as the respective temperatures vary. Accordingly, the magnitudes of the currents (e.g., the output current waveforms 832 and 834) switched by switches S10 and S14 vary in accordance with temperature.

As described herein, the power switching delay circuit (e.g., the circuit 300) is arranged to delay the rising edge of a first switching waveform (coupled to the hotter switch) with respect to the rising edge of the second switching waveform (coupled to the cooler switch) by a delay determined in response to the local temperature delta signal. The determined delay can be generated by delaying a first control signal for activating the rising edge of the first switching waveform and/or by advancing a second control signal for activating the rising edge of the second switching waveform. The delayed rising edge controls a rate of change of temperature, such that the switching temperature waveforms 822 and 826 gradually converge (e.g., in response to the temperature-controlled feedback loop, described hereinabove). The switching of the switches S10 and S14 at a common temperature equalizes (for example) the impedance-as-a-function-of-temperature, such that similar amounts of current are switched (at a common point in time)

by each of the switches at similar (e.g., nearly equal) temperatures. Accordingly, activation of the power switch S14 can occur after the activation of the power switch S10 by a delay determined in response to a first power switching delay (e.g., determined locally to S14). Likewise, activation of the power switch S10 can occur after the activation of the power switch S14 by a delay determined in response to a second power switching delay (e.g., determined locally to S10.)

For example, at 10 microseconds into the simulation, the difference in peak switching currents (e.g., of the output current waveforms 832 and 834) is around 10 amperes, which causes a different temperature rise in each of the switches S10 and S14. The temperature feedback loop control circuitry evaluates the resulting temperature differences and determines a delay for the rising edge of the output current waveform 834. The delay in the rising edge of the output current waveform causes the temperature indicated by the switching temperature waveform 826 to change, such that the switching temperature waveforms 822 and 826 converge towards a common (e.g., similar) value.

Modifications are possible in the described examples, and other examples are possible, within the scope of the claims.

What is claimed is:

1. An apparatus, comprising:
   a first power switching circuit coupled to receive a power switching control signal and arranged to activate a first power switch in response to the power switching control signal; and
   a second power switching circuit coupled to receive the power switching control signal, arranged to activate a second power switch in response to the power switching control signal, and arranged to determine a first power switching delay in response to a temperature indication of the second switch and in response to a combined temperature indication of the first and second power switches, wherein the second power switching circuit is arranged to activate the second power switch at a first delayed time after the activation of the first power switch, and wherein the first delayed time follows the activation of the first power switch by the determined first power switching delay.

2. The apparatus of claim 1, wherein the first power switching circuit is further arranged to determine a second power switching delay in response to a temperature indication of the first switch and in response to the combined temperature indication of the first and second power switches, wherein the first power switching circuit is arranged to activate the first power switch at a second delayed time after the activation of the second power switch, and wherein the second delayed time follows the activation of the second power switch by the determined second power switching delay.

3. The apparatus of claim 2, wherein the first and second power switching circuits are arranged on separate dies.

4. The apparatus of claim 2, wherein the temperature indication of the first power switch is generated in response to a temperature-dependent voltage generated in response to a temperature of the first power switch, and wherein the temperature indication of the second power switch is generated in response to a temperature-dependent voltage generated in response to a temperature of the second power switch.

5. The apparatus of claim 2, wherein the temperature indications of the first and second power switches are respectively first and second temperature indication currents, wherein the first and second temperature indication currents are summed to generate the combined temperature indication.

6. The apparatus of claim 5, wherein the first power switching circuit is coupled to a first differential amplifier that is arranged to control the second power switching delay in response to a amplifying a difference of the temperature indication of the first power switch and the combined temperature indication.

7. The apparatus of claim 6, wherein the second power switching circuit is coupled to a second differential amplifier that is arranged to control the first power switching delay in response to a amplifying a difference of the temperature indication of the second power switch and the combined temperature indication.

8. The apparatus of claim 7, wherein the second power switching circuit includes a capacitor for generating a delayed power switching control signal in response to the output of the second differential amplifier and in response to an assertion of the power switching control signal.

9. The apparatus of claim 2, wherein the power switching control signal is a high-side power switching control signal, and wherein the apparatus of claim 2 comprises:
   a third power switching coupled to receive a low-side power switching control signal, arranged to activate a third power switch in response to the power switching control signal, and arranged to determine a third power switching delay in response to a temperature indication of the third switch and in response to a combined temperature indication of the third and fourth power switches, wherein the third power switching circuit is arranged to activate the third power switch at a third delayed time after the activation of the third power switch, and wherein the third delayed time follows the activation of the third power switch by the determined third power switching delay; and
   a fourth power switching circuit coupled to receive the low-side power switching control signal, arranged to activate a fourth power switch in response to the power switching control signal, and arranged to determine a fourth power switching delay in response to a temperature indication of the fourth switch and in response to a combined temperature indication of the third and fourth power switches, wherein the fourth power switching circuit is arranged to activate the fourth power switch at a fourth delayed time after the activation of the fourth power switch, and wherein the fourth delayed time follows the activation of the fourth power switch by the determined fourth power switching delay.

10. The apparatus of claim 9, wherein drains of the first and second power switches and drains of the third and fourth power switches are coupled to a common switched node, wherein the sources of the first and second power switches are coupled to a high-side power supply rail, and wherein the sources of the third and fourth power switches are coupled to a low-side power supply rail.

11. The apparatus of claim 10, wherein the high-side power switching control signals are generated by a pulse-width modulator (PWM) coupled to the common switched mode.

12. The apparatus of claim 11, wherein the low-side power switching control signals are generated by the pulse-width modulator (PWM) coupled to the common switched mode.

13. The apparatus of claim 11, wherein the temperature indication of the first power switch is generated in response to integrating the temperature-dependent voltage generated in response to a temperature of a die of the first power switch, and wherein the temperature indication of the second power switch is generated in response to integrating the temperature-dependent voltage generated in response to a temperature of a die of the second power switch.

14. A system, comprising:
a first temperature sensing element thermally coupled to a first power switch and arranged to generate a temperature indication of the first power switch;
a second temperature sensing element thermally coupled to a second power switch and arranged to generate a temperature indication of the second power switch;
a first power switching circuit coupled to receive a power switching control signal and arranged to control the first power switch in response to the power switching signal; and
a second power switching circuit coupled to receive the power switching control signal, coupled to receive the temperature indication of the second power switch, and arranged to generate a first power switching delay in response to the temperature indications of the first and second power switches, wherein the second power switch is activated in response to the first power switching delay, and wherein drains of the first and second power switches are coupled to a common switched node.

15. The system of claim 14, wherein the first power switching circuit is arranged to generate a second power switching delay in response to the temperature indications of the first and second power switches, and wherein the first power switch is activated in response to the second power switching delay.

16. The system of claim 15, comprising a pulse-width modulator circuit arranged to generate the power switching control signal in response to a voltage generated at the common switched node.

17. A method, comprising:
generating a first temperature indication in response to a temperature of a first power switch;
generating a second temperature indication in response to a temperature of a second power switch;
receiving a power switching control signal for activating the first and second power switches;
delaying the received power switching control signal in response to the temperature indications of the first and second power switches; and
activating the second power switch in response to the delayed power switching control signal.

18. The method of claim 17, wherein the first power switch is on a first die, and wherein the second power switch is on a second die.

19. The method of claim 18, further comprising summing respective currents generated in response to the first and second temperature indications, wherein the respective currents generated in response to the first and second temperature indications are summed at a node common to the first and second dies, wherein the respective currents generated in response to the first and second temperature indications are summed to generate an average temperature indication, and wherein the received power switching control signal is delayed in response to the average temperature indication.

* * * * *